United States Patent
Thompson et al.

[11] Patent Number: 5,154,199
[45] Date of Patent: Oct. 13, 1992

[54] SEMICONDUCTOR PROCESSOR DRAINING

[75] Inventors: Raymon F. Thompson; Aleksander Owczarz, both of Kalispell, Mont.

[73] Assignee: Semitool, Inc., Kalispell, Mont.

[21] Appl. No.: 653,491

[22] Filed: Feb. 8, 1991

Related U.S. Application Data

[62] Division of Ser. No. 42,951, Apr. 27, 1987, Pat. No. 5,022,419.

[51] Int. Cl.⁵ ............................................. B08B 3/02
[52] U.S. Cl. .................................. 134/111; 134/153; 134/157; 134/200; 134/155
[58] Field of Search ............... 134/110, 109, 111, 902, 134/147, 153, 157, 200, 155, 186; 210/97, 98, 299, 305, 307; 68/28 F

[56] References Cited

U.S. PATENT DOCUMENTS

| | | | |
|---|---|---|---|
| 1,035,480 | 8/1912 | Schodde | 210/307 X |
| 2,675,012 | 4/1954 | Scales | 210/307 X |
| 2,677,381 | 5/1954 | Fisher | 134/111 X |
| 3,214,026 | 10/1965 | Behrens | 210/307 X |
| 3,341,016 | 9/1967 | Paasche | 210/307 X |
| 3,756,410 | 9/1973 | Moody et al. | 210/305 X |
| 3,804,758 | 4/1974 | Cooper et al. | 210/97 X |
| 4,458,703 | 7/1984 | Inoue et al. | 134/902 |
| 4,536,845 | 8/1985 | DeVale et al. | 210/98 X |
| 4,731,154 | 3/1988 | Hazlitt et al. | 134/902 X |
| 4,753,258 | 6/1988 | Seiichiro | 134/902 X |
| 4,828,660 | 5/1989 | Clark et al. | 134/902 |

FOREIGN PATENT DOCUMENTS

61-164226 7/1986 Japan ................... 134/902

Primary Examiner—Frankie L. Stinson
Attorney, Agent, or Firm—Wells, St. John & Roberts

[57] ABSTRACT

Rinser dryer system for rising process chemical from silicon or gallium arsenide wafers, substrates, masks or disks and drying of silicon or gallium arsenide wafers, substrates, masks or disks positioned in a wafer cassette. A wafer cassette is positioned in a rotor assembly and the rotor assembly positioned within a removable heated chamber bowl. The wafer cassette rotates past rising and drying manifold nozzles. The removable chamber bowl is secured to a rinser mounting plate by quick disconnect hardware for removal and for external cleansing. A broken chip collector in a lower portion of an exhaust manifold assembly removes small broken chip remains. An acidity sensor is positioned in a bottom portion of the exhaust manifold assembly for monitoring rinse effluent during the rising process. A gated exhaust valve in an exhaust gas manifold of the exhaust manifold assembly provides for gases to exhaust to an external location. A computer controls cycling of the process modes as the silicon or gallium arsenide wafers, substrates, masks or disks are sprayed, washed, rinsed, and dried.

16 Claims, 11 Drawing Sheets

SEMICONDUCTOR PROCESSOR DRAINING

CROSS REFERENCES TO CO-PENDING APPLICATIONS

This is a divisional application of co-pending U.S. patent application Ser. No. 07/042,951 filed Apr. 27, 1987, and now U.S. Pat. No. 5,022,417.

BACKGROUND OF THE INVENTION

1. Field of the Invention

The present invention pertains to a rinser dryer system, and more particularly, pertains to a rinser dryer with a removable process bowl for achieving rapid external process bowl exchange such as for cleansing.

2. Description of the Prior Art

Prior art rinsers and dryers, such as for silicon wafers, have provided for washing and rising of wafer chips, but have not provided for a process and means of cleansing a device should the fragile silicon or gallium arsenide wafers, substrates, masks or disks break or disintegrate during high speed spinning in rinsing or drying processes.

Long down times are required to clean and remove silicon wafer particles from the prior art rinsers and dryers, often causing lengthy delays in a sequence of processing steps involved in the processing of silicon wafers. Operator error also causes improper processing of silicon wafers due to inattentiveness on the part of the operator or misunderstanding of the process by the operator.

U.S. Pat. No. 4,300,581, entitled "Centrifugal Wafer Processor", issued Nov. 17, 1981, is assigned to the same assignee of this patent. While effective for the purpose intended, the bowl in that patent is not quickly nor easily removable. The present invention incorporates new and novel interchangeable bowl structure from panel access and structure, particle collector, gaseous venting structure, a probe well and related structure thereto, for processing of a member.

The present invention overcomes the deficiencies of the prior art by providing a rinser dryer process chamber including a removable quick change chamber bowl for cleansing, and removable fragment collector for removal of chip debris external to the rinser dryer framework.

SUMMARY OF THE INVENTION

A general purpose of the present invention is to provide an automated processor system for silicon or gallium arsenide wafers, substrates, masks, disks or similar units. The processor system advantageously utilizes a removable bowl. The terms of silicon or gallium arsenide wafers, substrates, masks or disks are by way of example and for purposes of illustration only and not to be construed as limiting of the present invention.

According to one embodiment of the present invention, there is provided a rinser dryer system including a drive motor, including a seal housing, a drive plate and bowl seal positioned over and about an obliquely positioned mounting plate secured to a frame. A removable rinse bowl of a predetermined geometrical configuration secures with quick disconnect or like hardware to the mounting plate over a bowl seal member. A deionized water spray configured manifold and an $N_2$ configured manifold are positioned on the mounting plate and within the confines of the removable bowl to provide for wafer rinsing and drying as the motor and drive plate spin a cassette rotor containing a wafer carrier with silicon or gallium arsenide wafers, substrates, masks or disks internally within the removable rinse bowl. A knurled nut secures the carrier rotor to the drive plate, providing for quick removal of the rotor. A pneumatically sealed door seals the outer end of the removable chamber bowl. A pressurized labyrinth seal in the drive plate prevents fluid flow out through the mounting plate. The rotor, drive plate, mounting plate, removable bowl and associated components are mounted at a predetermined angle to assist in effluent drainage into an exhaust manifold assembly where fluids pass into a main chamber, over and through a perforated particle filter, into a collector chamber, and then overboard through a drain fitting in the lower extremities of the main chamber. Gases and water vapor pass through the exhaust gas manifold, a pneumatically operated gate valve, and overboard through a vacuum exhaust line. The exhaust valve assembly contributes to a number of operational functions as later described in detail including separation of gases and liquids, evacuation of gases and liquids, collecting of any debris, isolation of the bowl environment, as well as other operational functions. A plurality of pneumatic solenoids and valves, heaters, manifolds and other devices are computer controlled such as by a microprocessor to provide proper rinse and dry cyclings as required. The rinser dryer housing and frame includes a configured base for drop-in platform installation. A single angled utility plate supports substantially all of the major operational components. A positioner brake resistor is also provided for rapid deceleration of the drive motor and alignment of the rotor. Functional diagnostic information is displayed on the front panel of an electronic control module display. All $H_2O$ and $N_2$ supply connectors, quick bowl removal hardware, a drainage port, a resistivity sensor, and a broken wafer collector are readily accessible from the front of the rinser dryer providing for front access and physical positioning of the system. A labyrinth seal is provided about the motor with a gas backup to prevent outside particles from entering the bowl environment. The flow of gas, preferably $N_2$, from the labyrinth seal to the exhaust ports and exhaust area prevents particles from the motor and bearings from entering the bowl environment.

One significant aspect and feature of the present invention is a rinser dryer utilizing a readily removable rinse chamber bowl for cleansing.

Another significant aspect and feature of the present invention is a broken substrate collector for prevention of drain stoppage and cleansing of debris from the inner surface of the bowl of the rinser dryer.

Another significant aspect and feature of the present invention is a configured exhaust gas manifold providing for the exiting and removal of gases and vapors to an external point. The manifold separates the gases from the fluids for exhaust control with respect to the environment of the chamber.

Another significant aspect and feature of the present invention is a preferably angularly mounted chamber bowl and drive assembly providing for gravitational assist of downward continuous flow of effluent drainage, as well as rising and drying. The bowl can be positioned between the horizontal and vertical axis, preferably at about an angle of ten degrees to the horizontal axis.

Yet another significant aspect and feature of the present invention is a fully automated computer controlled rinser dryer.

Another significant aspect and feature of the present invention is a sensor positioned in a removable collector to monitor variables, such as the resistivity or other qualitative factors depending upon the particular sensor or exiting fluids.

A further significant aspect and feature of the present invention is a spray nozzle positioned substantially perpendicular to the axis of rotation of the carrier, rotor and the bowl.

Having thus described the embodiments of the present invention, it is a principal object hereof to provide an automated rinser dryer process system.

One object of the present invention is a rinser dryer including an obliquely mounted rinse chamber bowl which is quickly removable for the purpose of cleansing of the bowl away from the system. Change of chamber bowls is done for the purpose of reducing the maintenance time required to maintain a clean bowl environment which correspondingly increases processing productivity. The rotor is as easily and quickly changed as the bowl.

Another object of the present invention is a rinser dryer including a removable broken substrate collector for the purpose of eliminating drain clogging.

A further object of the present invention is a rinser dryer including an exhaust gas manifold for the control of gases and vapors.

An additional object of the present invention is a resistivity sensor positioned in a drain for monitoring solution resistivity, pH or any other qualitative factor.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
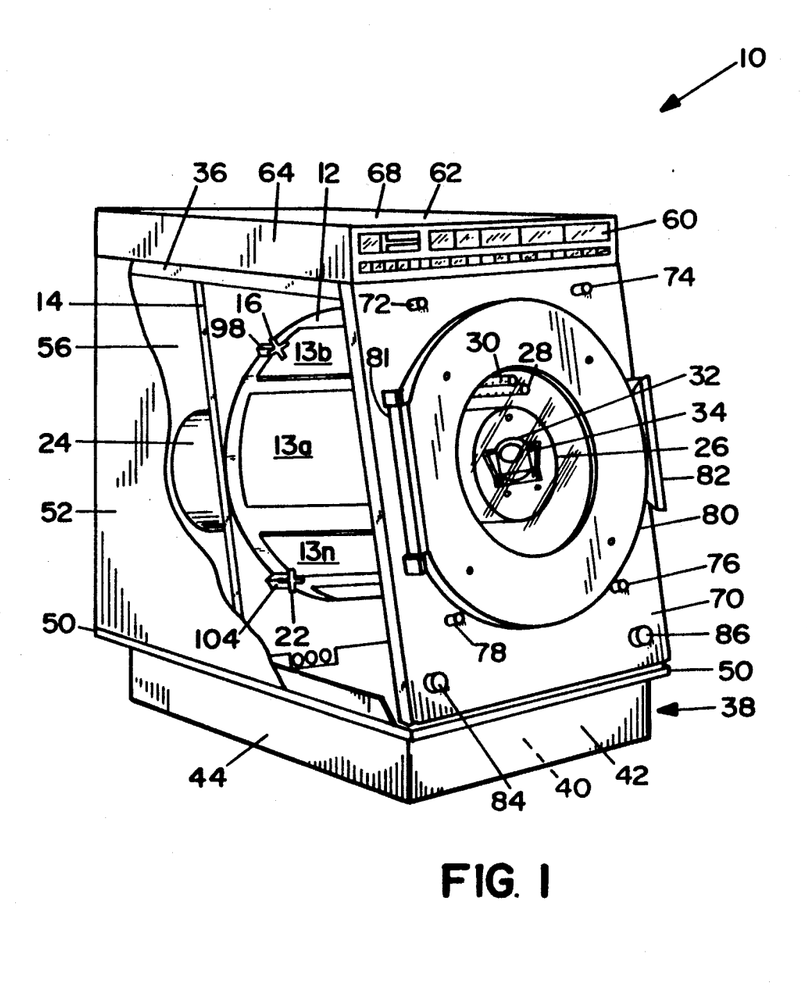
FIG. 1 illustrates a cutaway perspective view of a rinser dryer process system, the present invention.
Figure 2:
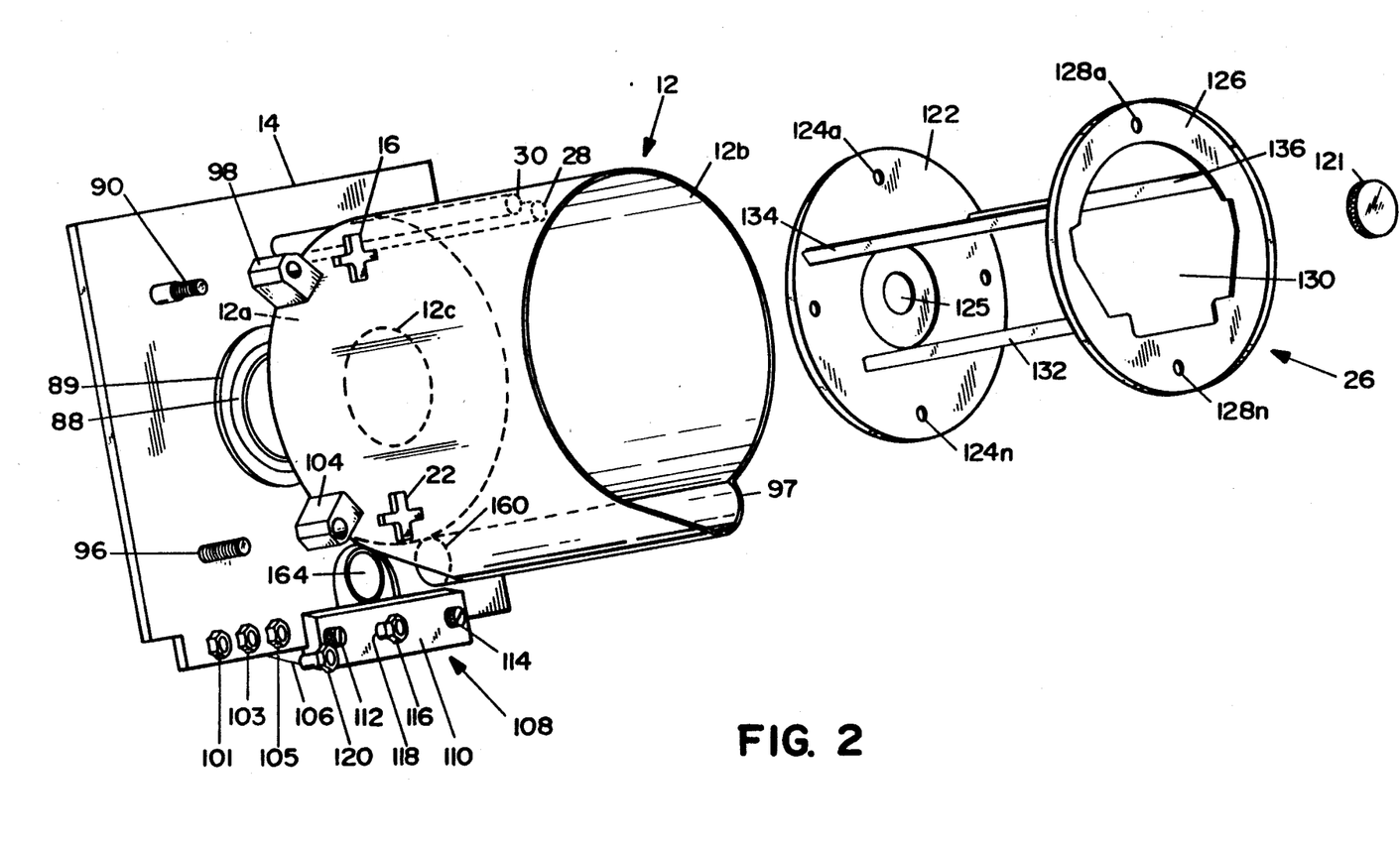
FIG. 2 illustrates an exploded view of a removable bowl and a mounting plate.
Figure 3:
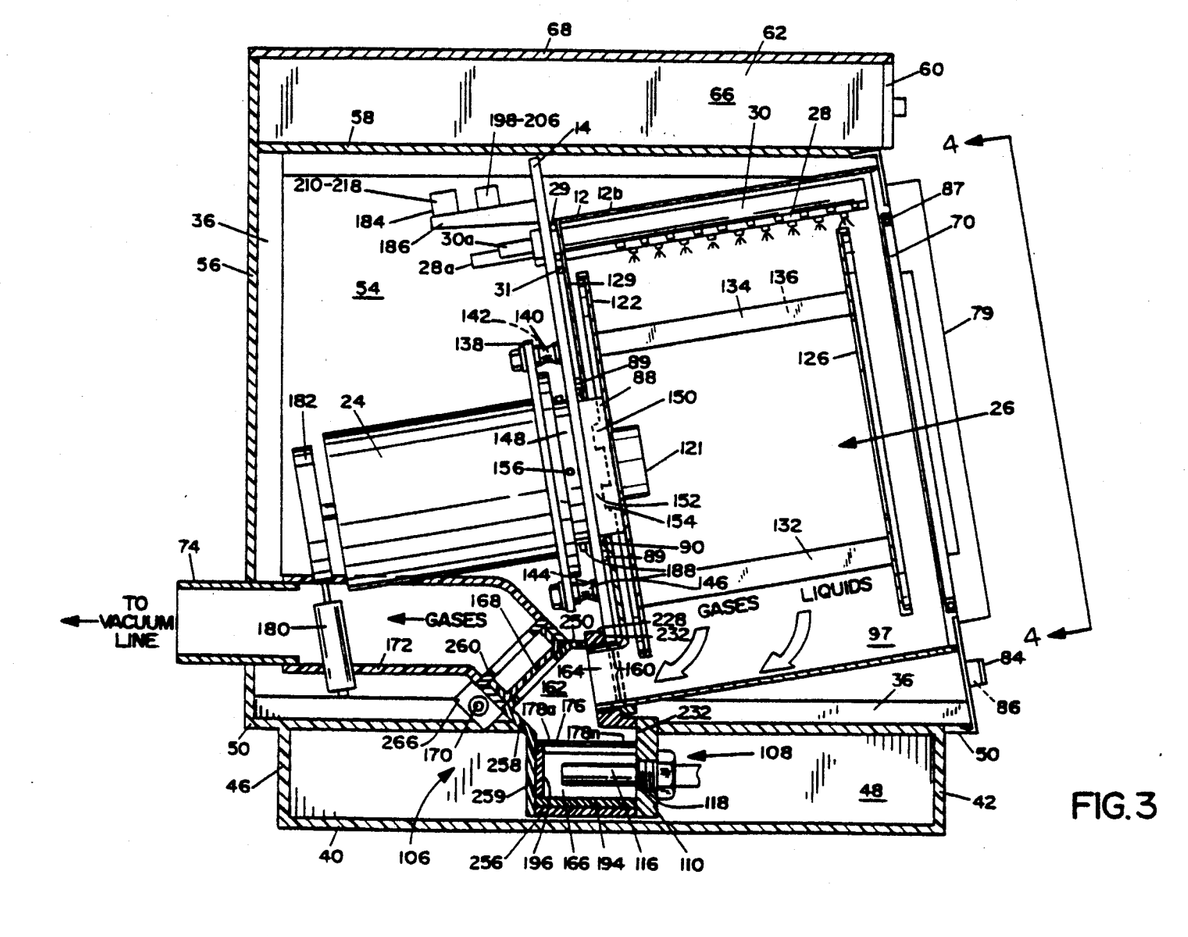
FIG. 3 illustrates a side view in cross section of the rinser dryer.
Figure 4:
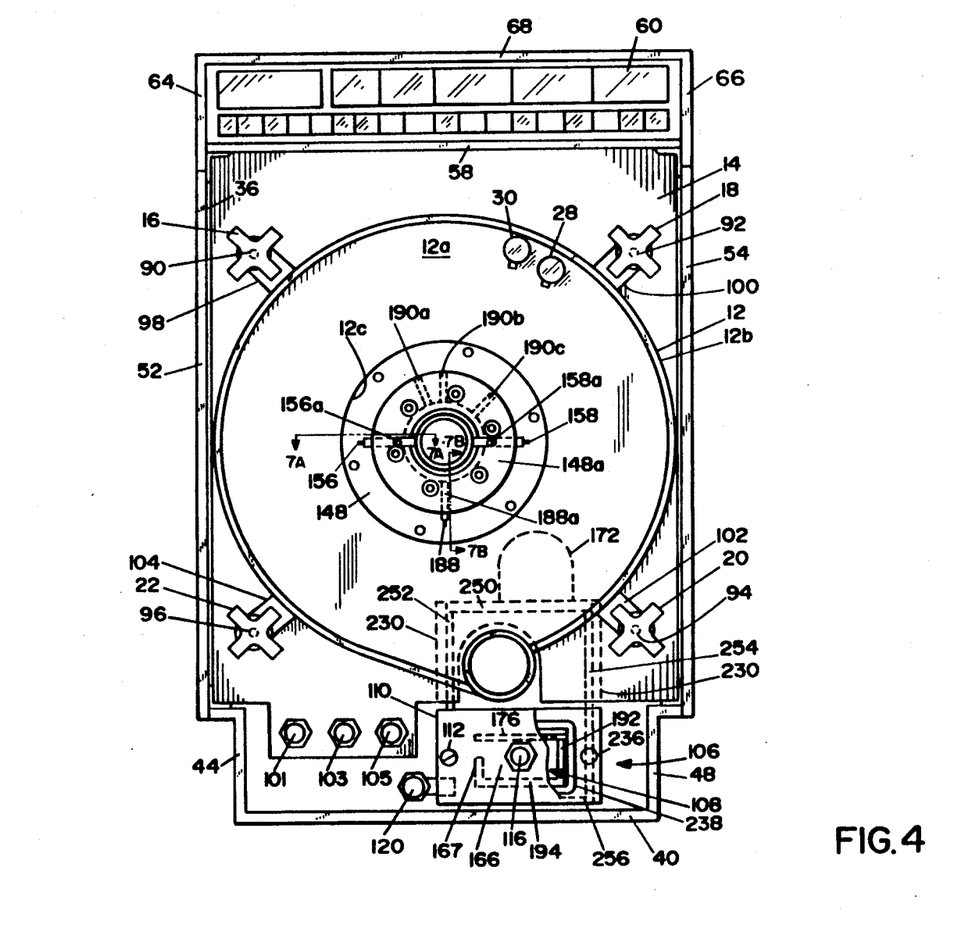
FIG. 4 illustrates a front view of the rinser dryer with the front panel, drive plate and a portion of the seal housing removed.

FIG. 1 illustrates a rinser dryer system 10, the present invention, including a quick and readily removable and interchangeable rinse bowl 12 positioned on a mounting plate 14. Removable bowl 12 defines a processing chamber within which semiconductor wafer, substrates, disks and similar units are processed. Quick action internally threaded release knobs 16–22, as also illustrated in FIGS. 2 and 4, secure the removable bowl 12 to the mounting plate 14 as described later in detail. The bowl 12 can be stainless steel, TEFLON, or other suitable material. The bowl can be of one material and have a removable liner for further quick change-over. A plurality of blanket heaters $13a$–$13n$ are positioned about the bowl for internal temperature control. The direct drive motor 24 secures to the mounting plate 14 to rotate a cassette rotor 26 within the confines of the removable bowl 12. Pressurized deionized $H_2O$ or a like liquid processing fluid is supplied and enters the removable bowl 12 through a DI $H_2O$ spray manifold 28 for pressure rinsing of process chemical from the wafers 32 contained in a wafer cassette 34 as the rotor 26, wafers 32 and cassette 34 spin past the rinse manifold 28 in the rinser dryer 10. Nitrogen or a like processing fluid gas is supplied and enters the removable bowl 12 through manifold 30 for process drying after rising is completed as either predetermined or as detected by a resistivity sensor. The mounting plate 14, the removable bowl 12 and associated component members are positioned within a rectangular configured framework 36. The configured framework 36 positions over and about a base member 38 including a bottom 40, vertical sides 42 and 44 and vertical sides 46 and 48 as illustrated in FIG. 3, and a flange lip 50 which extends horizontally and outwardly over the vertical sides 42–48 to accommodate mounting of the base member 38 on a platform top and within a like configured cavity. Plastic side panel 52, a back panel 56 and a top panel 58, as illustrated in FIG. 3, position over and about the configured framework 36. An electronic control module 60 slides into a water proof enclosure 62 positioned over the top panel 58, which is illustrated in FIG. 3. The enclosure 62 bottom includes the upper portion of panel 58 as its bottom part, side member 64, and side member 66 as illustrated in FIGS. 3 and 4, a top member 68 and a portion of the back panel 56. Side panel references are also illustrated in FIGS. 3 and 4. An angled front panel 70 fits over the angled portion of the configured framework 36 and includes quick release front panel release screws 72–78, a front access opening which is covered by a see-through sealed door 80, door hinge 81, door handle 82, start button 84, stop button 86, and a circular inflatable door seal 87 as illustrated in FIG. 3.

FIG. 2 illustrates an exploded view of the removable bowl 12 and mounting plate 14 assembly where all numerals correspond to those elements previously described. A rotary drive plate 88, driven by motor 24 as illustrated in FIG. 1, and a bowl seal 89 positioned centrally on the mounting plate 14, are illustrated and described in detail in FIGS. 3 and 7. Securing means in the shouldered form of studs 90 and 94 and ordinary studs 92 and 96, as also illustrated in FIG. 4, are positioned to assure proper indexing and orientation of the removable bowl 12 when the corresponding geometrically configured polarized bowl brackets 98–104 mounted on the removable bowl 12 fit properly over, and only over, the shouldered studs 90-96. Bowl brackets 98-104 or like structure are positioned about the removable bowl 12, as illustrated, for engagement over and about corresponding studs 90-96, respectively. The bowl 12, including cylindrical side portion 12b, circular back plate 12a and back plate hole 12c, drain augmenting trough 97 and the mounting plate 14, are positioned in appropriate angular relationship to facilitate the flow of rinse fluid from the bowl 12, as is described later in detail.

A nitrogen supply port 101, a DI $H_2O$ supply port 103 and an additional DI $H_2O$ supply port 105 are positioned on the front lower portion of the mounting plate to allow important and easy frontal access capabilities for ease of rapid coupling or decoupling of supply $N_2$ or DI $H_2O$. A drain means which includes a gas/liquid separating manifold 106, as described later in detail, is mounted with appropriate hardware to the back side of the mounting plate 14, as illustrated in FIGS. 3, 4, 5, and 6. A removable broken chip or particle collector or separator 108 is positioned within a lower portion, and is integral to the exhaust gas manifold 106. The collector 108 is extracted manually to remove broken particles and bits of fractured or broken chips. This collector 108 is later described in detail in FIGS. 3, 4, and 6. The collector base plate 110 is secured to the exhaust gas manifold 106 with knurled/slotted machine screws 112 and 114. A resistivity sensor, pH sensor, or like qualitative sensor 116 is positioned in hole 118 for sensing acidity or pH of rinse effluent as sensed in the removable broken particle collector 108 prior to its discharge and drainage from the liquid drainage port 120.

The rotor 26 fits over, against, and about the drive plate 88 and is secured thereto by a hand-tightened knurled rotor mounting nut 121. The rotor 26 includes rotor plate 122, a plurality of fixture securement holes 124a-124n, and a rotor centering hole 125. A second rotor plate 126 includes fixture securement holes 128a-128n, cassette alignment hole 130 and parallel support members 132-136 affixed between rotor plates 122 and 126.

FIG. 3 illustrates a side view of the rinser dryer system 10 in cross section which also illustrates one mode of operation where all numerals correspond to those elements previously described. Rotor motor 24 and a motor mounting plate 138 are affixed to mounting plate 14 by vibration dampening rubber motor suspension members 140-146 and appropriate mounting hardware. A seal housing 148 affixes to motor 24, motor mount plate 138 and extends through the mounting plate 14. A drive plate 88 is driven by the motor 24, and includes an annular ring 150 mated with corresponding annular groove 152 in the seal housing 148 to form a labyrinth or second seal 154 between the stationary seal housing 148 and the rotary motion drive plate 88.

Figure 7A:
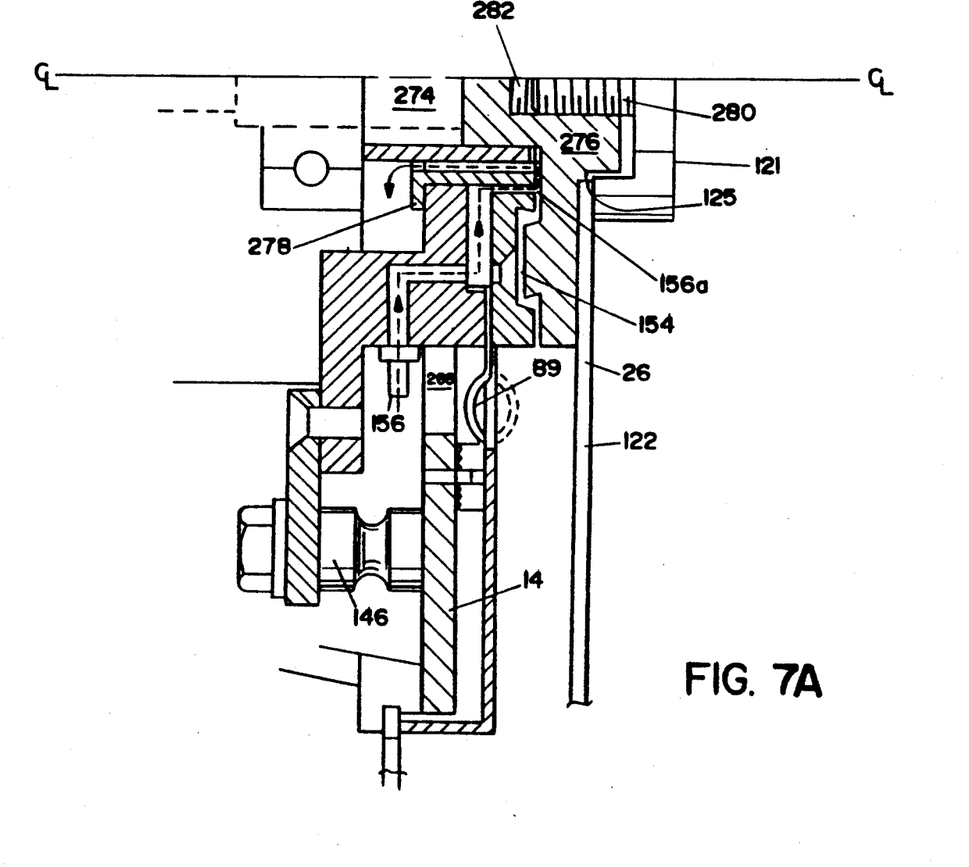
FIGS. 7A and 7B illustrate a composite cross section taken along line 7A—7A and 7B—7B of FIG. 4 also including a drive plate and seal housing.

Pressurized nitrogen enters the labyrinth seal 154 through $N_2$ inlet 156 and $N_2$ inlet 158, as also illustrated in FIG. 7, to maintain a positive pressure across the labyrinth seal 154 to prevent DI $H_2O$ and other $N_2$ from being blown out of the labyrinth seal area and into the motor 24 or other components aft of the mounting plate 14. A bowl or first seal 89 is positioned between the mounting plate 14 and the back wall 12a of the removable bowl 12 to seal the interior of the removable bowl 12 from ambient atmosphere. A door seal 87 is pressured with $N_2$ between the see-through door 79 and the panel front 70 to effect a door seal.

Manifolds 28 and 30 are secured to the mounting plate 14 with sealing rings 29 and 31 therebetween. Deionized water is injected through port 28a and into manifold 28 to rinse the wafer and silicon or gallium arsenide wafers, substrates, masks or disks as both spin about an axis as driven by the motor. After sequenced cycling and spinning, $N_2$ is injected into port 30a and into manifold 30 to complete the drying process. Rinse liquids and gases gather in the bowl trough 97 and exit with the help of gravity via the bowl exhaust tube 160 and into the exhaust gas manifold 106. It is particularly disclosed that the entire motor-removable drum rotor assembly is mounted at an angle of ten degrees by way of example and for purposes of illustration only, and not to be construed as limiting of the present invention, thus assiting in gravitational augmentation of effluent removal from the interior of the removable bowl 12. The angle of mounting can be configured to be between a horizontal plane and a vertical plane, but preferably in a range of 5° to 35° or 5° to 85°.

Pressurized $N_2$ from manifold 30 also forces internal gases through the bowl exhaust tube 160 and into the main chamber 162 of the exhaust manifold 106. Both fan-shaped and atomizing spray manifolds of 8 nozzles each are located about the wafers. Therefore, gravity and gas flow assist in a downward, continuous flow of chemicals. On-axis horizontal rotation spray application produces uniform coverage on both sides of the product.

Figure 6:
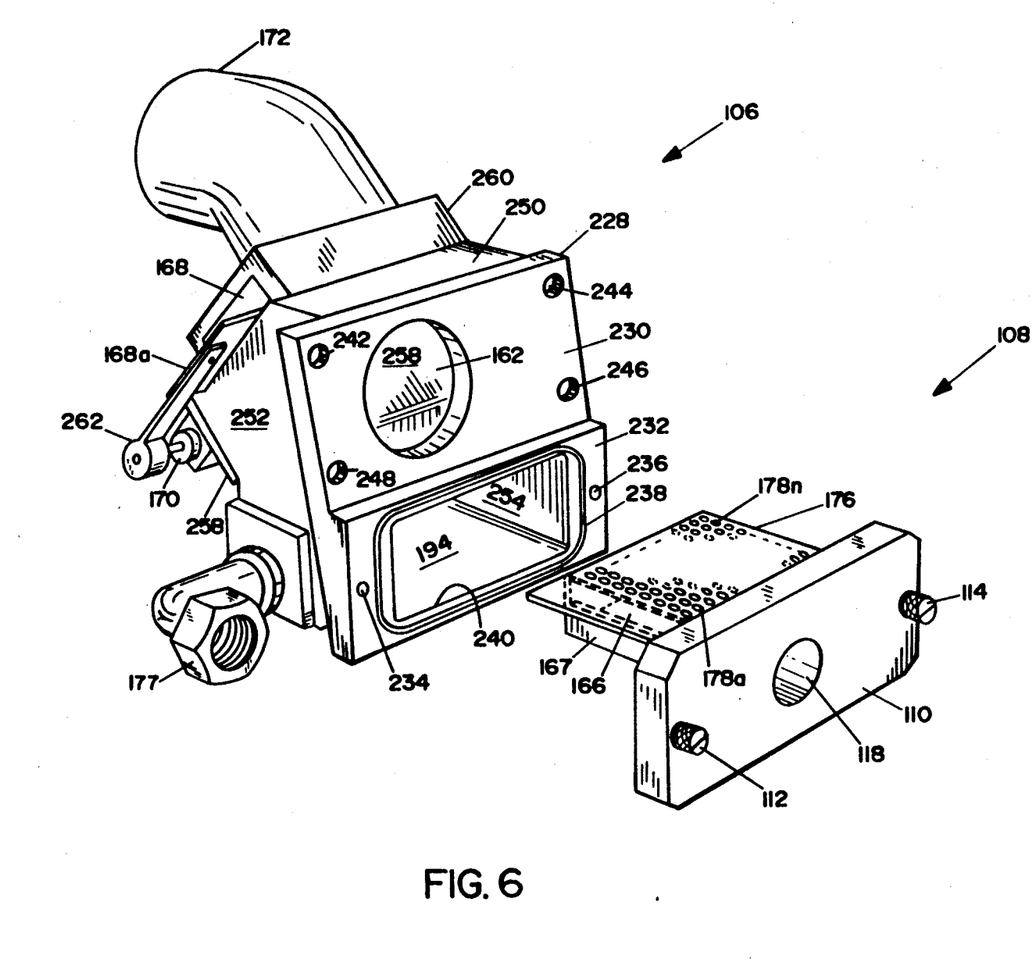
FIG. 6 illustrates a perspective view of the exhaust gas manifold and integral removable broken chip collector assembly.

The exhaust manifold 106 includes a main chamber 162, an inlet port 164, removable broken silicon wafer collector 108, a collector chamber 166, a gate valve 168, a pneumatic gate valve actuator 170, an angled gas exhaust duct 172, and is connected to an external vacuum tube 74 to exhaust gaseous fumes from the rinser dryer 10. The exhaust manifold 106 and associated components are described later in detail in FIGS. 4 and 6. Liquids exit the bowl exhaust tube 160 and into the main chamber 162, through a perforated plate 176 on the broken particle collector 108, into the collector chamber 166, past a resistivity sensor 116, out of the collector chamber 166, over a vertical dam member 167 as illustrated in FIG. 4, into a lower side portion of the main chamber, and then overboard through a forward facing drain fitting 177 as illustrated in FIGS. 4 and 6 to be recycled or dumped as the need requires.

In the event that any of the silicon or gallium arsenide wafers, substrates, masks or disks being processed chip or break into pieces, the bowl 12, including large portions of the broken pieces, can be readily removed by easily removing the front panel 70, removing the rotor mount nut 120, the rotor 26, and releasing the quick action release knobs 16-22 for easy removal of the bowl 12 and the broken pieces for facilitation of cleaning external to the rinser dryer 10. Any smaller broken parts are deposited on the perforated plate 176 of the broken wafer collector 108. If the particles are smaller than the perforations 178a-178n in the perforated plate 176, then the particles pass through the perforations to be contained in the interior of the collector chamber 166 by the dam member 167. The broken wafer 108 can then be removed with the chips or fragments deposited on the perforated plate 176 or within the collector chamber 166 for external cleaning of the wafer collector 108 prior to its next use.

A positioner brake 180, which acts against the circular stop plate 182 to quickly stop rotation of the motor 24 and rotor 26 to position and orient the rotor 26 in a position to accept a wafer basket, is controlled by the electronic control module 60. The electronic control module also controls various functions such as, but not limited to, pneumatic solenoids on pneumatic solenoid manifold 184 mounted on bracket 186, gate valve actuator 170, N₂ supply, DI H₂O supply, start sequence, stop sequence and numerous other functions as described later in detail in FIG. 8.

FIG. 4 illustrates a front view of the rinser dryer system 10 with the front panel 70 removed where all numerals correspond to those elements previously described. For clarity of illustration, the removable bowl 12, the mounting plate 14 and the associated components are viewed with respect to line 4—4 of FIG. 3. The bowl seal 89, a portion of the seal housing, and the drive plate 88 are also removed exposing the inner portions of seal housing 148 and the nitrogen inlet and outlet labyrinth ports 156a and 158a, respectively. A condensate drain fitting 188 and a channel 188a position to drain condensate from the seal housing 148. Air ports 190a, 190b and 190c position in the seal housing 148 for the exhausting of gases internal to the seal housing into the cabinetry interior where it is exited through the exhaust gas manifold system. A collector base plate 110 is illustrated as being secured to and against the exhaust gas manifold 106. Illustrated in particular is the dam member 167 and side bottom members forming one end of collector chamber 166. A chamber end member 196 is illustrated in FIG. 3.

Figure 5:
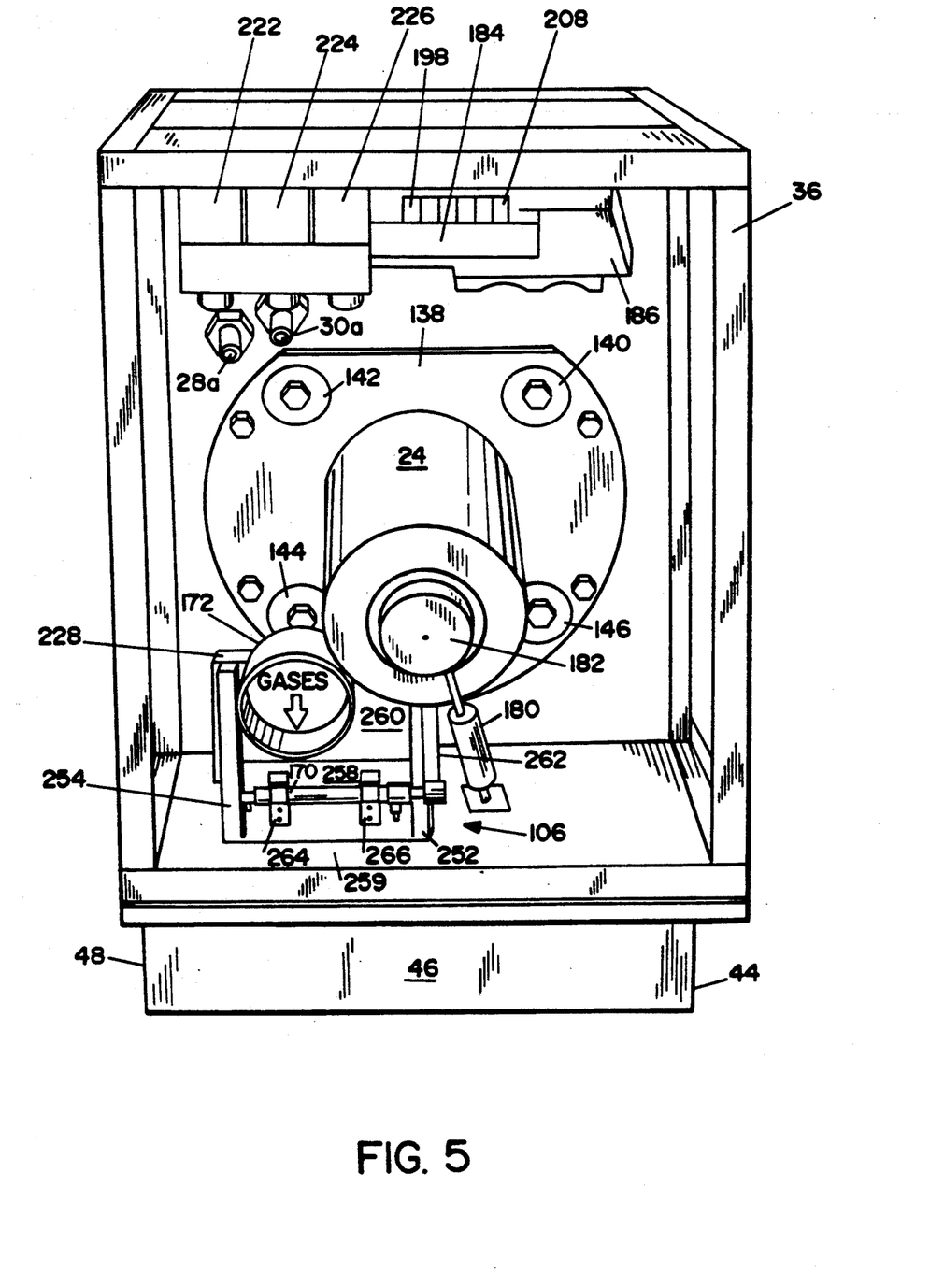
FIG. 5 illustrates a back view of the rinser dryer.

FIG. 5 illustrates a back view of the rinser dryer system 10 where all numerals correspond to those elements previously described. Solenoid valves 198 through 208, on a bracket 186, control gases and fluids within the rinser dryer 10 as described in FIG. 8. A pressure switch 222, adjustable restrictor 224, and a filter 226 mount as illustrated in the figure.

FIG. 6 illustrates a perspective view of the exhaust gas manifold 106 and the integral removable chip or particle collector 108, where all numerals correspond to those elements previously described. The collector 108 includes a base plate 110, knurled easily removable slotted screws 112 and 114, a threaded sensor receptor hole 118, resistivity sensor, pH sensor, or like qualitative sensor 116, a perforated top plate 176, perforations 178a-178n through top plate 176, a dammed collector chamber 166 formed by the perforated top plate 176, a dam vertical wall member 167, an end wall 196, bottom wall 198 as illustrated in FIG. 3, and side wall member 192 as illustrated in FIG. 4. Any small broken chips or particles can settle on the perforated plate 176 or migrate through the perforations 178a-178n and are trapped within the chamber 166, whereupon the wafer collector 108 is removed for external cleansing. The wafer collector is positioned within the manifold chamber 162 of the exhaust gas manifold 106, and functions to collect broken chips or particles, and to also sense resistivity, pH or other qualitative factor of the wash or rinse fluid.

The exhaust gas manifold 106 includes a mounting plate 228, including a planar manifold inlet surface member 230 and a planar collector mounting surface member 232. The planar mounting member includes screw holes 234 and 236 for mating with knurled/slotted screws 112 and 114 in the base plate 110. A sealing gasket 238 is positioned around and about a rectangular wafer collector entry hole 240 to effect and provide a seal between the base plate 110, the planar collector member 232, and the rectangular wafer collector hole 240. The planar manifold inlet member 230 includes a manifold inlet port 162 and holes 242-248 for securement to the back side of the mounting plate 14. A planar top member 250 and opposing side members 252 and 254, a bottom member 194, and an obliquely mounted manifold member 258 are positioned beneath the pneumatic actuating cylinder and between opposing configured side members 252 and 254. A vertical back member 259 completes the exhaust gas manifold 106. A rectangular gate valve chamber 260, positioned over and about the corresponding edges of top member 250, parallel opposing side members 252 and 254, an oblique member 258, includes a sliding gate valve member 168 and gate valve tab 168a which are actuated by pneumatic valve actuator 170 and actuator arm 262 to exhaust gaseous particles and vapors through the attached exhaust gas outlet port 172 to the outboard tube 174. The pneumatic actuating cylinder 170 is secured to the exhaust gas manifold oblique member 258 by means of brackets 264 and 266 as illustrated in FIG. 5. A forward facing liquid drain is positioned in the side member 252 to drain effluent from the main chamber 162 after its passage through the collector chamber 166.

Figure 7B:
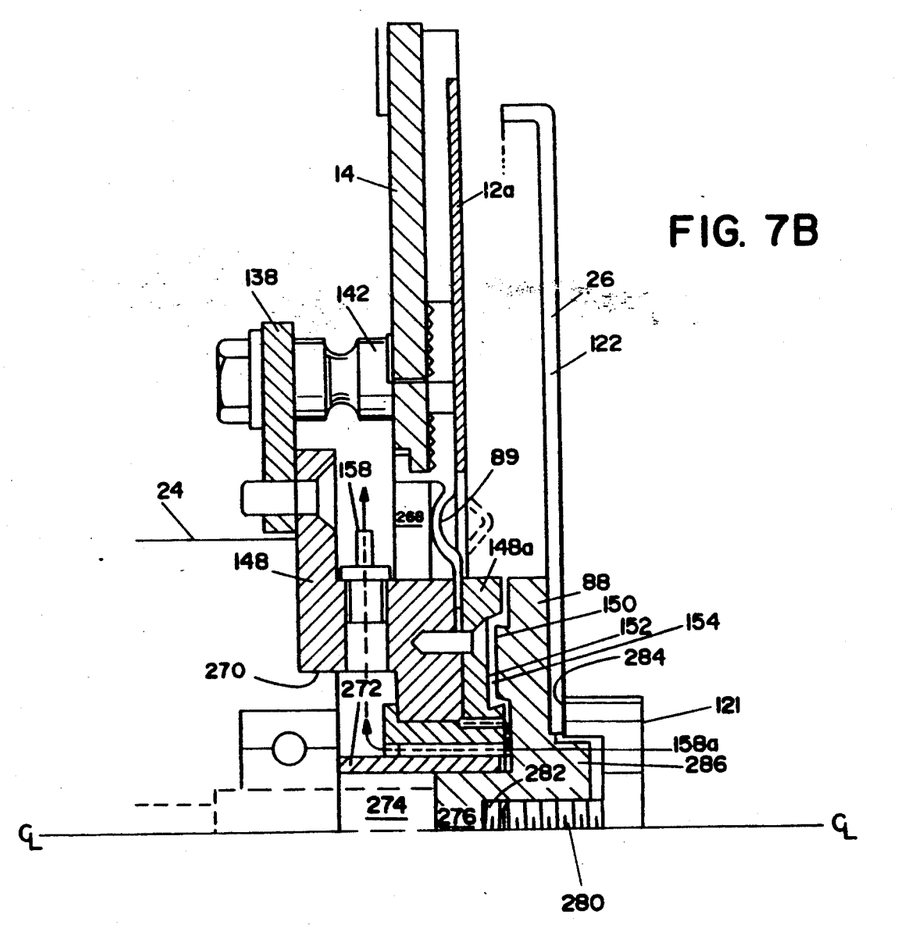

FIGS. 7A and 7B illustrate a composite cross section taken along line 7A—7A and 7B—7B of FIG. 4 where cross section 7A—7A is illustrated in a normal configuration and cross section 7B—7B is rotated 90° counter clockwise about the centerline to show a continuous figure. All numerals correspond to those elements previously described. Although the drive plate 88 and only a portion of the seal housing 148 are not illustrated in FIG. 4, the members are included in this cross section for purposes of completeness and clarity. Seal housing 148 is positioned in a hole 268 in mounting plate 14, and accommodates the drive motor 24 centrally in a drive motor hole 270. The seal housing is positioned over and about a motor mount plate 138. Appropriate hardware secures the motor mount plate 138 via rubber suspension members 140-146 to the mounting plate 14 as illustrated in FIG. 3. A press fitting 272 is positioned over the motor drive shaft 274, and also accommodates cylindrical shaft portion 276 of drive plate 88, thus securing the drive plate to the motor 24. A seal housing clamp plate 148a containing annular groove 152 is secured with appropriate hardware to hold bowl seal member 148 and sealing the gasket seal 89 against circular bowl back 12a and mounting plate 14 to seal the interior of the removable bowl 12 from the atmosphere. The annular ring in the drive plate 88 mates with the annular groove 152 of the seal housing clamp plate 148a to form a labyrinth seal 154 which is sealed and pressurized by N₂ entering the N₂ inlet fitting 156, N₂ inlet fitting 158 as illustrated in FIG. 4, passing through the N₂ inlet port 156a and N₂ inlet port 158 as illustrated in FIG. 4, through the labyrinth seal 154, through the N₂ outlet ports 158a, 190a-190b as illustrated in FIG. 4, and also through the N₂ drain outlet fitting 188. The curtain of gas thus provided at the seal creates a differential pressure friction free, particle barrier at the motor shaft and about a press fit baffle 278 positioned concentric to motor shaft 274. The arrows in the figure illustrate the gas flow. A threaded shaft 280 protruding from the knurled mouting knob 120 engages threads 282 in the drive plate 88 to tighten the annular portion 284 of the knob against and thus secure the rotor plate 122 of rotor 26 to the drive plate 88. The rotor plate hole 125 centers over and aligns with the cylindrical shaft 286 prior to the placement and tightening of the knurled mounting knob 120 over the rotor plate 122.

Figure 8:
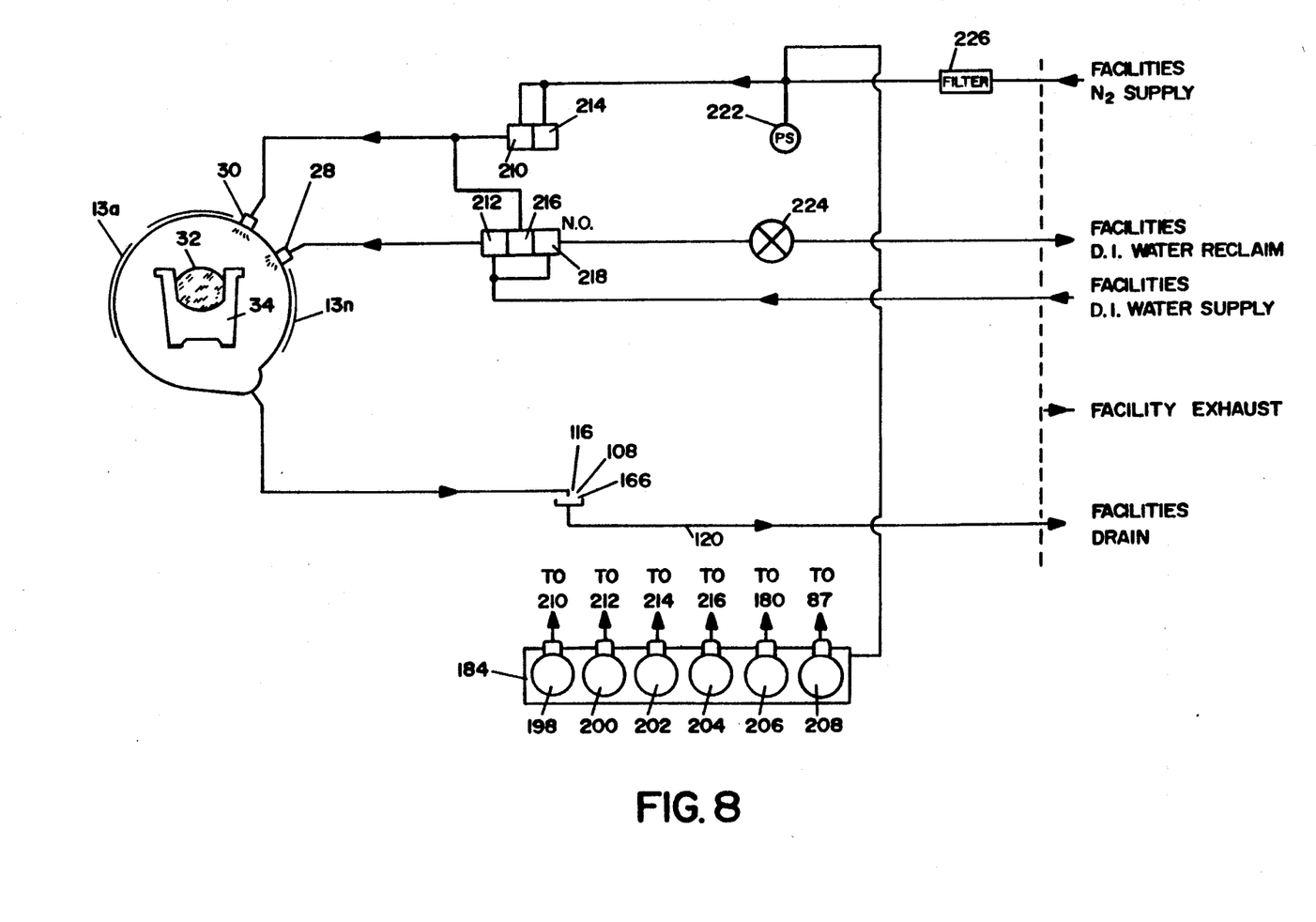
FIG. 8 illustrates a pneumatic and fluid flow chart for the rinser dryer.

FIG. 8 illustrates a pneumatic and fluid flow chart of the rinser dryer system 10 where all numerals correspond to those elements previously described. The electronic control module 60 senses and controls pneumatic solenoids 198-208 in the solenoid manifold 184 which in turn actuates valves 210-218 and other pneumatic devices including a motor stop actuator and a door seal. The system is controlled by a microprocessor. A drying valve 210 is operated by a 4-way dryer valve solenoid activator 198. A rinse valve 212 is operated by a 4-way rinse solenoid actuator 200. An $N_2$ low flow bowl purge valve 214 is operated by a 4-way bowl purge solenoid activator 202. A rinse manifold purge valve 216 is operated by a 4-way rinse manifold purge solenoid activator 204. When a normally closed rinse valve 212 opens, the recirculating valve 218 is closed by a pneumatic connection to prevent system back flow. The 4-way solenoid activator 206 ports pneumatic pressure to the motor rotor stop positioner to stop motor rotation. A 3-way door seal solenoid activator 208 pressurizes the door seal 87 during rinse/dry processing. A filter 226 and pressure switch 222 are in series with the $N_2$ supply line. An adjustable restrictor is in series with the deionized water reclaim load to control return flow. All connecting tubing is TEFLON PFA, a fluoropolymer, or like material as required.

Figure 9:
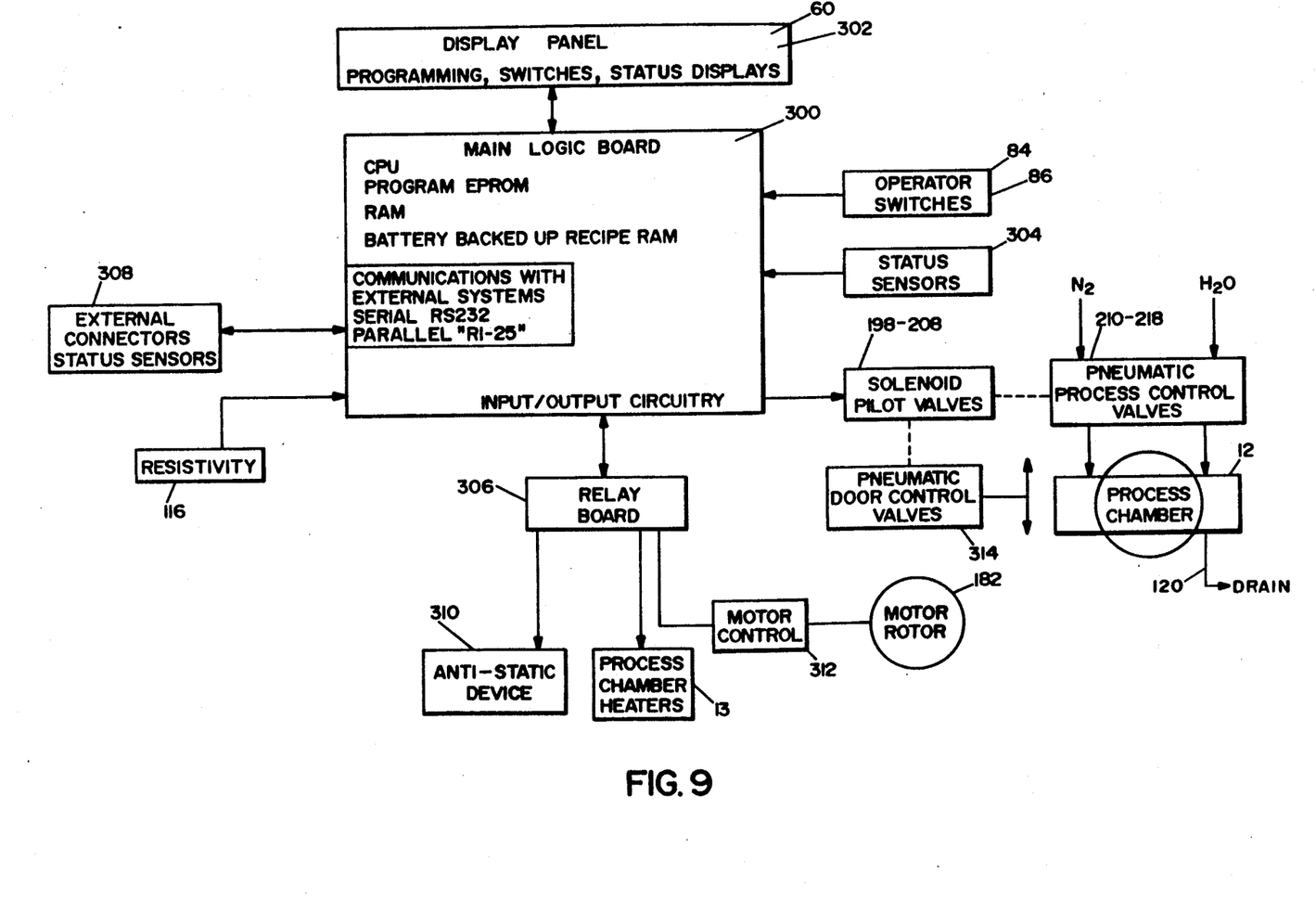
FIG. 9 illustrates a block diagram flow chart for the rinser dryer process system.

FIG. 9 illustrates a block diagram flow chart for the rinser dryer system 10 where all numerals correspond to those elements previously described. A main logic microprocessor board 300 interacts with the display panel 302 of the electronic control module 60 to display useful user information such as, but not limited to, programming information, switch position and status displays. The main logic board 300 receives inputs from the resistivity sensor 116, operator switches 84 and 86, status sensors 304 and relay board 306. The main logic board 300 interacts with external connectors status sensors 308 and relay board 306. The relay board 306 controls an antistatic device 310, process bowl heaters 13, motor control 312, and the motor brake 182. Input/output circuitry in the main logic board 300 also controls solenoid valves 198-208, pneumatic process control valves 210-218 and $H_2O$ and $N_2$ inputs into the process bowl 12. A control for an optional pneumatic door actuator for raising or lowering a sliding door is also provided by pneumatic door control valves 314.

Figure 10:
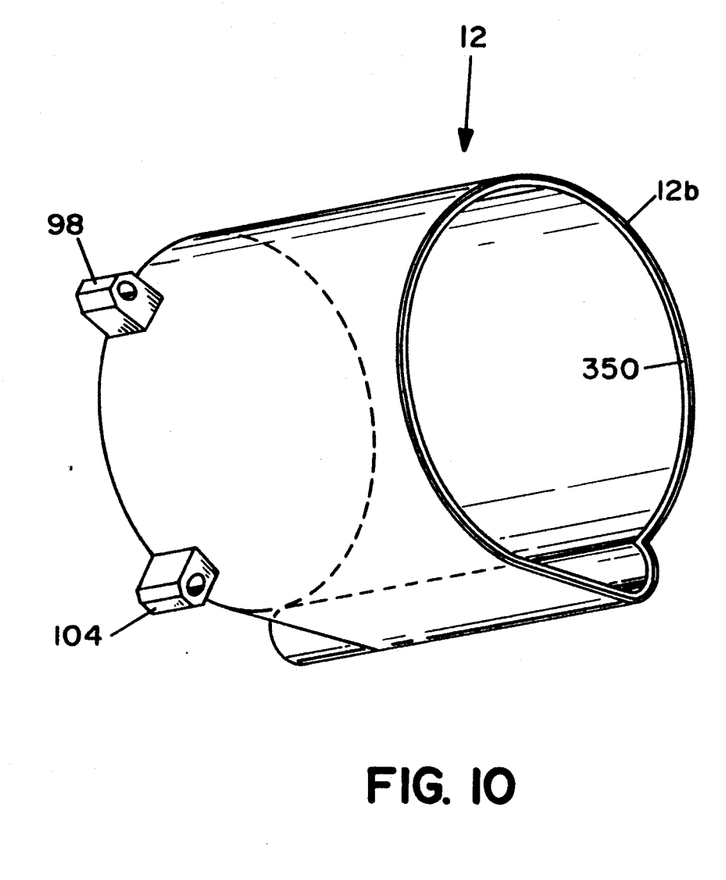
FIG. 10 illustrates a perspective view of a removable bowl liner in a bowl.

FIG. 10 illustrates a perspective view of a removable bowl liner 350 in a bowl 12. The removable bowl liner can be of TEFLON, a fluoropolymer, or other material. The bowl 12 and bowl liner 350 can be incorporated into a single bowl member where the bowl is entirely of one material.

Various modifications can be made to the present invention without departing from the scope thereof. A heater and air filter can be connected to the $N_2$ line through a pneumatic valve for introducing heated filter air or gas to the bowl. The door can be a hinged door or a sliding door to conserve horizontal space.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. An apparatus for processing semiconductor wafers, substrates, and disks, comprising:
   a housing;
   at least one bowl mounted within the housing; said bowl at least partially defining a processing chamber;
   a rotor mounted for rotation at least partly within the processing chamber;
   means for imparting controlled rotary motion to the rotor;
   means for supplying at least one liquid processing fluid to the processing chamber;
   drain means in fluid communication with the bowl for draining fluid therefrom;
   at least one particle separation chamber for selectively removing fragments and other particles from liquid effluent draining from the processing chamber and through said drain means; said particle separation chamber including a particle separator for isolating solid fragments or other particles from flowing liquid effluent; said particle separator comprising a perforated screen and a dammed liquid collection chamber beneath the perforated screen;
   at least one sensor for sensing effluent passing through said dammed liquid collection chamber.

2. An apparatus as defined in claim 1 and further comprising at least one nozzle mounted to deliver liquid processing fluid within the bowl, said at least one nozzle being positioned for spraying liquid processing fluid onto a unit supported by the rotor and toward said drain means.

3. An apparatus as defined in claim 1 and further defined by said particle separator being removable from said housing for replacement or cleaning of particles therefrom.

4. An apparatus as defined in claim 1 and further comprising at least one gas vent in fluid communication with said drain means above said particle separator.

5. An apparatus for processing semiconductor wafers, substrates, and disks, comprising:
   a housing;
   at least one bowl mounted within the housing; said bowl at least partially defining a processing chamber;
   a rotor mounted for rotation at least partly within the processing chamber;
   means for imparting controlled rotary motion to the rotor;
   means for supplying at least one liquid processing fluid to the processing chamber;
   drain means in fluid communication with the bowl for draining fluid therefrom;
   at least one particle separation chamber for selectively removing fragments and other particles from liquid effluent draining from the processing chamber and through said drain means; said particle separation chamber including a particle separator for isolating solid fragments or other particles from flowing liquid effluent;
   said particle separator being removable from the housing structure for cleaning or replacement, and said particle separator comprising:
   a perforated screen and a dammed collector chamber, the dammed collector chamber being defined by a floor and sidewalls rising therefrom, one of the sidewalls rising a distance from the chamber floor which is less than the rising distance of the remaining sidewalls, the one sidewall thereby forming a vertical dam over which liquid flows but which traps small particles that flow through the perforated screen for isolating such particles from the flowing liquid.

6. A semiconductor processor for processing semiconductor wafers, substrates, and disks, comprising:
a housing;
a bowl mounted within the housing;
a rotor rotatably received within the bowl, the rotor having means for holding at least one unit for centrifugal processing;
means for imparting rotary motion to the rotor;
at least one nozzle mounted within the bowl, the nozzle being connected with a source of liquid and being positioned for spraying liquid onto the at least one unit held by the rotor;
drain means in fluid communication with the bowl for draining fluid therefrom, the drain means including a particle separation chamber adapted to receive liquid draining from the unit and to receive fragments of a units that structurally fail during processing;
the particle separation chamber including a particle separator for isolating solid fragments or other particles from flowing liquid, the particle separator being removable from the housing structure for cleaning or replacement, the particle separator comprising;
a perforated screen and a dammed collector chamber, the dammed collector chamber being defined by a floor and sidewalls rising therefrom, one of the sidewalls rising a distance from the chamber floor which is less than the rising distance of the remaining sidewalls, the one sidewall thereby forming a vertical dam over which liquid flows but which traps small particles that flow through the perforated screen for isolating such particles from the flowing liquid.

7. The semiconductor processor of claim 6 wherein the perforated screen overlies the sidewalls of the dammed collection chamber.

8. The semiconductor processor of claim 6 further comprising a sensor extending through one of the sidewalls and into the inner dammed collection chamber for determining a property of effluent discharged from the bowl.

9. An apparatus for processing semiconductor wafers, substrates, and disks, comprising:
at least one processing bowl which at least partially defines a processing chamber;
a rotor mounted for rotation at least partly within the processing chamber;
motor means providing controlled rotary motion to the rotor;
at least one processing fluid supply for supplying at least one processing fluid to the processing chamber;
drain means in fluid communication with the bowl for draining fluid therefrom;
at least one particle separation chamber for selectively removing fragments and other particles from liquid effluent draining from the processing chamber and through said drain means; said particle separation chamber including a particle separator for isolating solid fragments or other particles from flowing liquid effluent;
said particle separator comprising a perforated screen and a dammed liquid collection chamber beneath the perforated screen;
at least one sensor for sensing effluent passing through said dammed liquid collection chamber.

10. An apparatus as defined in claim 9 and further defined by said particle separator being removable from said housing for replacement or cleaning of particles therefrom.

11. An apparatus as defined in claim 9 and further comprising at least one gas vent in fluid communication with said drain means above said particle separator.

12. An apparatus for processing semiconductor wafers, substrates, dsks, and similar units, comprising:
at least one processing bowl which at least partially defines a processing chamber;
a rotor mounted for rotation at least partly within the processing chamber;
motor means providing controlled rotary motion to the rotor;
at least one processing fluid supply for supplying at least one processing fluid to the processing chamber;
drain means in fluid communication with the bowl for draining fluid therefrom;
at least one particle separation chamber for selectively removing fragments and other particles from liquid effluent draining from the processing chamber and through said drain means; said particle separation chamber including a particle separator for isolating solid fragments or other particles from flowing liquid effluent;
said particle separator being removable from the housing structure for cleaning or replacement, and said particle separator comprising:
a perforated screen and a dammed collector chamber, the dammed collector chamber being defined by a floor and sidewalls rising therefrom, one of the sidewalls rising a distance from the chamber floor which is less than the rising distance of the remaining sidewalls, the one sidewall thereby forming a vertical dam over which liquid flows but which traps small particles that flow through the perforated screen for isolating such particles from the flowing liquid.

13. An apparatus for processing semiconductor wafers, substrates and disks, comprising:
at least one processing bowl which at least partially defines a processing chamber;
a rotor mounted for rotation at least partly within the processing chamber;
motor means providing controlled rotary motion to the rotor;
at least one processing fluid supply for supplying at least one processing fluid to the processing chamber;
drain means in fluid communication with the bowl for draining fluid therefrom;
at least one removable particle collector; said particle collector including a perforated piece which removes chips from the effluent stream draining through the particle collector; said particle collector also having a dammed collection chamber beneath the perforated piece; said perforated piece and said dammed collection chamber being mounted to a particle collector base to form a removable particle collector assembly which is detachable from remaining portions of said apparatus.

14. An apparatus as defined in claim 13 and further defined by at least one sensor for sensing effluent passing through the dammed collection chamber.

15. An apparatus as defined in claim 13 and further defined by at least one sensor mounted to said base for sensing effluent passing through said dammed liquid collection chamber.

16. An apparatus according to claim 13 and further comprising at least one gas vent in fluid communication with said drain means above said particle collector.

* * * * *